United States Patent [19]

Kittaka et al.

[11] Patent Number: 4,876,476
[45] Date of Patent: Oct. 24, 1989

[54] CHIP TYPE PIEZOELECTRIC DEVICE

[75] Inventors: Toshihiko Kittaka; Akira Ando; Yukio Sakabe, all of Kyoto, Japan

[73] Assignee: Murata Manufacturing Co., Ltd., Japan

[21] Appl. No.: 189,150

[22] Filed: May 2, 1988

[30] Foreign Application Priority Data

Apr. 30, 1987 [JP] Japan .................... 62-108121

[51] Int. Cl.$^4$ .................... H01L 41/08
[52] U.S. Cl. .................... 310/320; 310/366; 310/358
[58] Field of Search ............. 310/320, 321, 358, 359, 310/366, 311

[56] References Cited

FOREIGN PATENT DOCUMENTS

| 0024819 | 3/1981 | Japan | 310/311 |
| 0172821 | 9/1984 | Japan | 310/320 |
| 0121785 | 6/1985 | Japan | 310/311 |
| 0123122 | 7/1985 | Japan | 310/320 |
| 0132413 | 6/1987 | Japan | 310/311 |

Primary Examiner—Mark O. Budd
Attorney, Agent, or Firm—Ostrolenk, Faber, Gerb & Soffen

[57] ABSTRACT

A chip type piezoelectric device includes an element body formed of cofired ceramic material and having at least a pair of excitation electrodes opposed to each other with a portion of the element body interposed therebetween. At least the portion interposed between the excitation electrodes has piezoelectricity imparted thereto, whereby this portion serves as a vibrating portion. Of the pair of excitation electrodes at least one excitation electrode is positioned in the interior of the element body, and the element body is formed with a cavity only on the side of this interiorly positioned excitation electrode away from the vibrating portion.

7 Claims, 3 Drawing Sheets

CHIP TYPE PIEZOELECTRIC DEVICE

BACKGROUND OF THE INVENTION

1. Field of the Invention

This invention relates to a piezoelectric device of, e.g., the energy trapping type, utilizing thickness expansion vibration or thickness shear vibration, such as a vibrator, filter, trap or discriminator, and particularly it relates to a chip type piezoelectric device having an element body with an integrally sintered piezoelectric ceramic structure.

2. Description of the Prior Art

When it is desired to obtain a resonant frequency of, e.g., 10 MHz using a piezoelectric element in the form of a single plate of piezoelectric ceramic material having electrodes formed on oppposite surfaces thereof, the thickness of such single plate would have to be 200 μm or thereabouts. Therefore, the mechanical strength would be low and the element or device, as it is, would be difficult to handle. As an approach to solving these problems it is the usual practice to employ resin dipping or packaging, but in each case lead terminals must be attached to the respective electrodes, adding to the size of the device; particularly, the height of a device in its mounted position increases.

To attempt to solve the prior art problem described above, a chip type piezoelectric device of the construction shown in FIG. 7 has been proposed (for example, Japanese Patent Application Laying-Open Gazette No. 172821/1984). The piezoelectric device shown in FIG. 7 has an element body 1 formed of cofired ceramic material and internally provided with a pair of excitation electrodes 2 and 3 opposed to each other. The excitation electrodes 2 and 3 are electrically connected to external electrodes 4 and 5, respectively, formed on the exterior of the element body 1.

The ceramic material forming the element body 1 has piezoelectricity imparted thereto so that when a driving or excitation voltage is applied thereto by the external electrodes 4 and 5, the portion defined between the excitation electrodes 2 and 3 vibrates at a predetermined frequency. Cavities 6 and 7 are formed on the respective sides of the excitation electrodes 2 and 3 opposite to the vibrating portion defined between the electrodes 2 and 3, thereby to make the vibrating portion vibrate independently of its surrounding areas.

According to the chip type piezoelectric device as shown in FIG. 7, since the thickness of the element body 1 can be increased, the mechanical strength of the element body 1 can be sufficiently high. Further, since the presence of the cavities 6 and 7 prevents vibration in regions between the respective cavities 6 and 7 and the respective outer surfaces of the element body 1, it is possible to mount the device directly on a printed circuit board or the like. Therefore, the device can be easily handled while being reduced in size, and its height as mounted can be reduced as well.

However, the chip type piezoelectric device shown in FIG. 7 has a vital drawback: The resonant frequency of said chip type piezoelectric device is determined by the distance between the excitation electrodes 2 and 3 forming a pair, such distance being already determined at the firing stage performed to obtain the element body 1. Therefore, once the chip type piezoelectric device has been obtained, it is impossible to make any adjustment, e.g., a fine adjustment, of the resonant frequency thereof.

SUMMARY OF THE INVENTION

This invention is directed to a chip type piezoelectric device comprising an element body formed of cofired ceramic material, at least a pair of excitation electrodes formed in an opposite manner to each other with a portion of said element body interposed therebetween, at least said portion of said element body having piezoelectricity imparted thereto, whereby said portion is made to serve as a vibrating portion. To solve the technical problem described above, the following construction is employed in this invention.

That is, this invention is characterized in that at least one of said pair of excitation electrodes is positioned in the interior of said element body and a cavity is formed only on the side of said interiorly positioned excitation electrode opposite to said vibrating portion.

According to this invention, a cavity is formed in connection with only one of the pair excitation electrodes. The other excitation electrode, itself disposed on the side not formed with a cavity, and/or a thin ceramic portion positioned on the side of said other excitation electrode opposite to the vibrating portion, integrally vibrates as part of the vibrating portion. Theefore, for example, if grinding or mass loading is applied to said other excitation electrode and/or the portion of the element body positioned on the side not formed with such cavity, an adjustment, e.g., a fine adjustment, of the frequency can be easily made.

Further, the chip type piezoelectric device according to this invention can be mounted directly on a printed circuit board or the like. Therefore, its height as mounted can be reduced. Further, the invention makes it possible to obtain a small-sized chip type piezoelectric device.

The advantages of the prior art shown in FIG. 7 over a piezoelectric element using a single sheet of piezoelectric ceramic material are, of course, retained also in this invention.

As for the excitation electrode on the side not formed with a cavity, as its distance from the surface of the element body increases, the resonant frequency characteristic of the piezoelectric device is degraded. Thus, preferably, said pair of excitation electrodes are shifted to one side in the direction of the thickness of the element body. By employing such construction, the excitation electrode which is on the side not formed with a cavity can be positioned on or near the surface of the element body and there is no possibility of substantially degrading the resonant frequency characteristic of the piezoelectric device.

These objects and other objects, features, aspects and advantages of the present invention will become more apparent from the following detailed descripiton of the present invention when taken in conjunction with the accompanying drawings.

DESCRIPTION OF THE PREFERRED EMBODIMENTS

Figure 1:
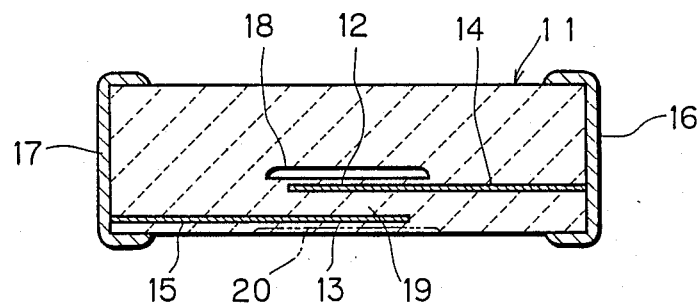
FIG. 1 is a sectional view showing a first embodiment of this invention, taken along the line I—I in FIG. 2.
Figure 2:
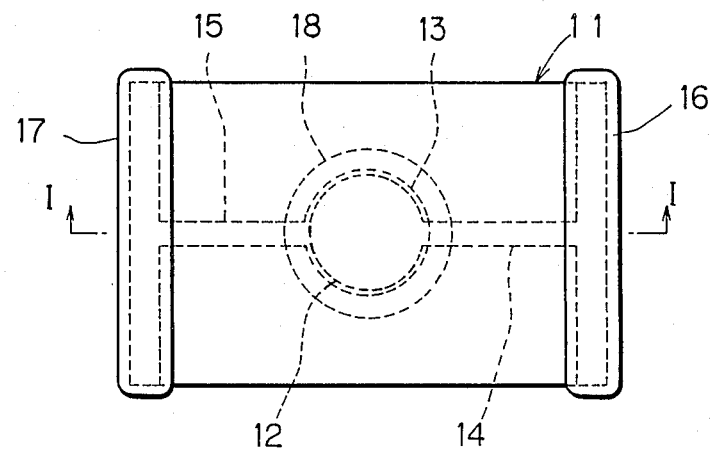
FIG. 2 is a plan view of the chip type piezoelectric device of FIG. 1.

A first embodiment of this invention is shown in FIGS. 1 and 2.

The chip type piezoelectric device shown in these figures has an element body 11 obtained, e.g., by sintering PZT type ceramic material. A pair of excitation electrodes 12 and 13 are embedded in the element body 11 so that they are opposed to each other with a portion of the element body 11 interposed therebetween. The excitation electrodes 12 and 13, as shown in dashed lines in FIG. 2, have, e.g, a circular pattern. In addition, in FIG. 2, the pair of excitation electrodes 12 and 13 are shown deviated from each other only for the sake of distinguishable illustration of these two electrodes 12 and 13. Actually, the electrodes 12 and 13 are of the same size and shape and, when seen in the direction of the thickness of the element body 11, lie on each other in substantially aligned relation.

The excitation electrodes 12 and 13 are extended to end surfaces of the element body 11 through narrow strip-like portions 14 and 15, respectively, and then electrically connected to external electrodes 16 and 17, respectively.

As is clear from FIG. 1, the excitation electrodes 12 and 13 are shifted to one side in the direction of the thickness of the element body 11. Of these electrodes 12 and 13, the electrode 12, which is positioned nearer to the center of the element body 11, has a cavity 18 formed thereabove. This cavity 18 functions to prevent vibration in a region defined between the cavity 18 and the upper outer surface of the element body 11. In addition, it is to be noted that such cavity is provided in connection with only one of the excitation electrodes 12 and 13.

To obtain the chip type piezoelectric device described above, the following method is employed.

First, to obtain the element body 11, a plurality of ceramic green sheets are prepared including at least ceramic green sheets having metal paste of, e.g., platinum printed thereon in a predetermined pattern to provide the excitation electrodes 12 and 13 and the lead portions 14 and 15, and a ceramic green sheet which has paste containing carbon or organic powder printed thereon or an organic sheet placed thereon to provide the cavity 18. These are laminated in a predetermined order and a pressure is applied thereto to promote close contact between the ceramic green sheets. For example, in the case of using PZT type ceramic material, said laminate is fired at temperatures of 1,200°–1,300° C. At this firing stage, the material present in the laminate to provide the cavity 18 is scattered to form the cavity 18 as desired. In this manner, the element body 11 of integrally sintered ceramic material is obtained.

Next, the external electrodes 16 and 17 are formed by applying metal paste of silver or the like to opposite ends of the element body 11 and firing the same.

Then, polarization treatment is applied to the ceramic material whch forms the element body 11. In this polarization treatment, electrodes (not shown) of, e.g., electrically conductive paint are temporarily formed on the upper and lower surfaces of the element body 11. And through these electrodes is applied a predetermined voltage for a predetermined time, under heat and in oil, whereby polarization treatment is applied in the direction of the thickness of the element body 11. Subsequently to the polarization treatment, the aforesaid electrodes of electrically conductive paint are removed by cleaning with a solvent or by etching. Alternatively, instead of applying polarization electrodes directly to the element body 11, a pair of elastic electrodes of electrically conductive rubber or the like may be used to hold the element body 11 therebetween for polarization treatment. Further, rather than polarizing the element body 11 in its entirety, only the portion lying between the pair of the excitation electrodes 12 and 13 may be polarized by applying a voltage through the electrodes 12 and 13.

The chip type piezoelectric device thus obtained is then tested for resonant frequency to see if it has the desired value. If its resonant frequency is lower than the desired value, then in the region shown, e.g., at 20 in FIG. 1, part of the surface of the element body 11 is removed. By increasing, e.g., the depth of this removed portion 20, it is possible to increase the resonant frequency as desired. The formation of the removed portion 20 may be effected by ordinary lapping, sand blasting, chemical etching or the like.

Figure 3:
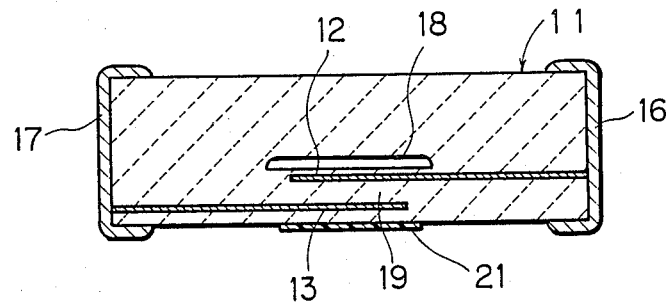
FIG. 3 is a sectional view showing the chip type piezoelectric device of FIG. 1 having a mass load 21 added thereto.

Conversely, if the resonant frequency measure is higher than the desired valve, then, as shown in FIG. 3, a mass load 11 may be added to the surface of the element body 11. As for the mass load 21, resin or the like may be used, such resin being applied by a method such as coating.

In the embodiment described above, the excitation electrodes 12 and 13 are, embedded in the element body 11; thus, excellent moisture resistance is ensured.

Figure 4:
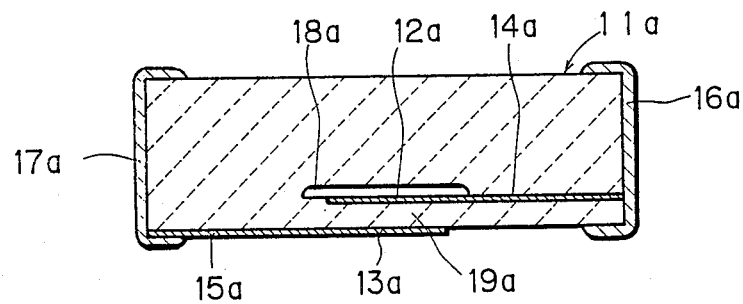
FIG. 4 is a sectional view of a second embodiment of the invention.
Figure 7:
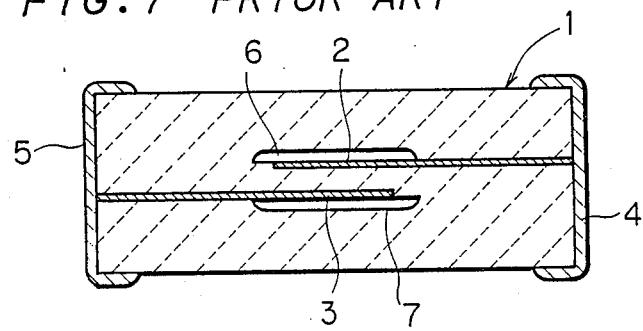
FIG. 7 is a sectional view of a conventional chip type piezoelectric device.

In FIG. 4, a second embodiment of the invention is shown. This second embodiment includes elements which are functionally the same as those of the embodiment of FIG. 1 described above; therefore, in FIG. 4, the corresponding elements are denoted by the reference numerals used in FIG. 1 plus the suffix "a" to avoid a repetitive description.

The difference of the second embodiment from the first one is that the lower excitation electrode 13a and the lead portion 15a connected thereto are exposed on the surface of the element body 11a. Further, the cavity 18a is formed in contact with the upper excitation electrode 12a. The rest of the arrangement is substantially the same asin th first embodiment.

In the second embodiment where the excitation electrode 13a is exposed on the surface of the element body 11, a frequency adjustment can be made by a method such as removing part of this excitation electrode 13a. Further, in the case of applying a mass load such as one shown at 21 in FIG. 3, this will be applied on the excitation electrode 13a; thus, in this case, the mass load will also perform the function of protecting the excitation electrode 13a.

As for the position at which the cavity 18a is formed, there is no substantial difference as compared with the cavity 18 taking the position shown in FIG. 1.

Figure 5:
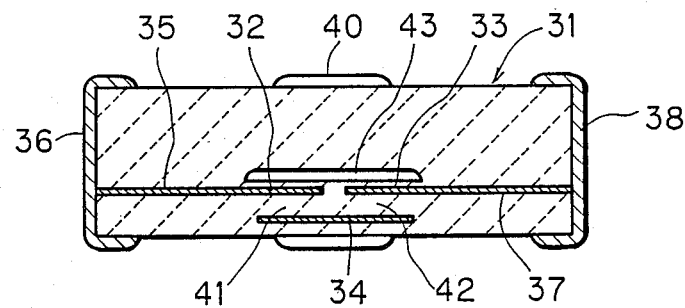
FIG. 5 is a sectional view showing a third embodiment of the invention, taken along the line V—V in FIG. 6.
Figure 6:
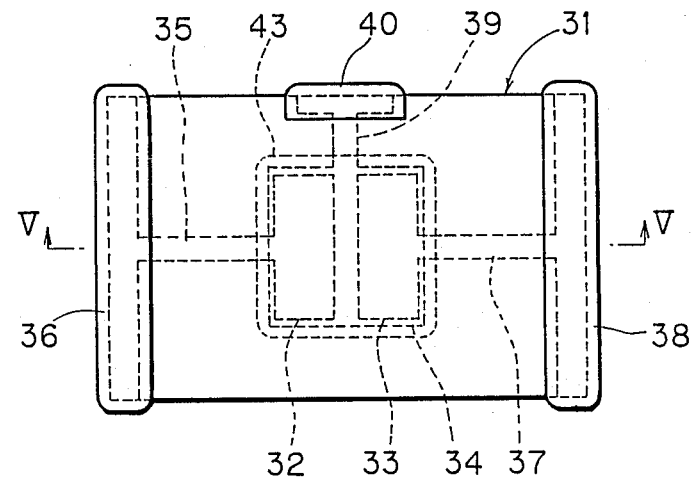
FIG. 6 is a plan view of the chip type piezoelectric device of FIG. 5.

A third embodiment of this invention is shown in FIGS. 5 and 6. This third embodiment represents an energy trapping type multimode filter.

The chip type piezolectric device forming such filter comprises an element body 31 formed of integrally sintered ceramic materialand internally provided with excitation electrodes 32, 33 and 34 on the input side, output side and grounding side, respectively. The excitation electrode 34 on the grounding side is opposed to the excitation electrodes 32 and 33 on the input and output sides. The excitation electrode 32 on the input side is extended to an end surface of the element body 31 through a lead portion 35 and there it is electrically connected to an external electrode 36 on the input side. Further, the excitation electrode 33 on the output side is extended through a lead portion 37 to the opposite end surface of the element body 31 and there it is electrically connected to an external electrode 38 on the output side. The excitation electrode 34 on the grounding side is extended to a lateral surface of the element body 31 through a lead portion 39 and there it is electrically connected to an external electrode 40 on the grounding side. The chip type piezoelectric device forming this filter has vibrating portions 41 and 42 defined between the excitation electrodes 32, 33 and the excitation electrode 34. A cavity 43 is formed only on the side of the excitation electrodes 32 and 33 opposite to the vibrating portions 41 and 42.

In this third embodiment, in the case where a frequency adjustment is made, grinding or the like is applied or a mass load is added to the surface of the element body 31 on the side where the excitation electrode 34 on the grounding side is present.

The invention has so far been described with reference to the first through third embodiments. The invention, however, is applicable not only to devices utilizing thickness expansion vibration such as chip type piezoelectric devices described in these embodiments, but also to devices utilizing thickness shear vibration.

Further, the patterns for the excitation electrodes are not limited to the illustrated circular or rectangular patterns; they may be any other shape.

Further, this invention is applicable to all devices that utilize piezoelectric resonance, such as vibrators, filters, traps and discriminators.

Although the present invention has been described and illustrated in detail hereinabove, it is clearly understood that the same is by way of illustration and example only and is not to be taken by way of limitation, the scope of the present invention being limited only by the terms of the appended claims.

What is claimed is:

1. A chip type piezoelectric device comprising:
  an element body formed of cofired ceramic material and having a predetermined thickness defined by first and second main surfaces;
  at least a pair of first and second excitation electrodes opposed to each other and spaced apart in the direction of the thickness of said element body with a portion of said element body interposed therebetween;
  at least said portion of said element body interposed between said first and second excitation electrodes having piezoelectric characteristics, said portion thereby being a vibrating portion which is excitable by said first and second excitation electrodes;
  at least said first excitation electrode being positioned in the interior of said element body; and
  said element body having a cavity formed therein only on the side of said first excitation electrode toward said first main surface, and outside said vibrating portion;
  wherein said first and second excitation electrodes are shifted to one side toward said second main surface in the direction of the thickness of said element body.

2. A chip type piezoelectric device as set forth in claim 1, wherein said second excitation electrode is positioned on said second main surface of said element body.

3. A chip type piezoelectric device asset forth in claim 1, wherein said first excitation electrode is spaced from the first main surface of said element body by a distance that is greater than a distance said second excitation electrode is spaced from said second main surface.

4. A chip type piezoelectric device comprising:
  an element body formed of cofired ceramic material and having a predetermined thickness defined by first and second main surfaces;
  at least a pair of first and second excitation electrodes opposed to each other and spaced apart in the direction of the thickness of said element body with a portion of said element body interposed therebetween;
  at least said portion of said element body interposed between said first and second excitation electrodes having piezoelectric characteistics, said portion thereby being a vibrating portion which is excitable by said first and second excitation electrodes;
  at least said first excitation electrode being positioned in the interior of said element body; and
  said element body having a cavity formed therein only on the side of said first excitation electrode toward said first main surface; and outside said vibrating portion;
  wherein said second excitation electrode is positioned in the interior of said element body, and the region of the second main surface of said element body on the side of said second excitation electrode which is away from said first excitation electrode has a removed portion defined therein forming a recess.

5. A chip type piezoelectric device as set forth in claim 1, wherein the region of the second main surface of said element body on the side of said second excitation electrode which is away from said first excitation electrode has a mass loaded applied thereto.

6. A chip type piezoelectric device as set forth in claim 1, further comprising:
  a third excitation electrode in the interior of said element body; which is opposed to said second excitation electrode in the direction of the thickness of said element body; with a second portion of said element body interposed therebetween;
  said second portion of said element body interposed between said third and second excitation electrodes having piezoelectric characteristics, said second portion thereby being a second vibrating portion which is excitable by said third and second excitation electrodes;
  said cavity formed in said element body being on the side of said third excitation electrode toward said first main surface, and outside said second vibrating portion.

7. A chip type piezoelectric device as set forth in claim 6, wherein said first and third excitation electrodes are substantially the same distance from each of said first and second main surfaces.

* * * * *